United States Patent [19]
Hongo

[11] Patent Number: 5,304,406
[45] Date of Patent: Apr. 19, 1994

[54] METHOD FOR FORMING AN ORGANIC FILM

[75] Inventor: Masashi Hongo, Kanagawa, Japan

[73] Assignee: Semiconductor Energy Laboratory Co., Ltd., Kanagawa, Japan

[21] Appl. No.: 928,098

[22] Filed: Aug. 13, 1992

Related U.S. Application Data

[63] Continuation of Ser. No. 737,032, Jul. 26, 1991, abandoned.

[30] Foreign Application Priority Data

Jul. 27, 1990 [JP] Japan .................................. 2-200075

[51] Int. Cl.⁵ .............................................. B05D 3/06
[52] U.S. Cl. .................................. 427/554; 427/255.6; 427/384; 427/557; 427/561; 427/595; 427/596
[58] Field of Search ................... 427/53.1, 55, 255.6, 427/554, 557, 561, 595, 596, 384

Primary Examiner—Bernard Pianalto
Attorney, Agent, or Firm—Sixbey, Friedman, Leedom & Ferguson

[57] ABSTRACT

A process for depositing an organic thin film is disclosed, which comprises continuously conducting purification of the raw materials and deposition of the film in the same apparatus.

11 Claims, 3 Drawing Sheets

METHOD FOR FORMING AN ORGANIC FILM

This application is a continuation of Ser. No. 07/737,032, filed Jul. 26, 1991, now abandoned.

FIELD OF THE INVENTION

The present invention relates to a method for forming an organic film and an apparatus for forming an organic film.

BACKGROUND OF THE INVENTION

Organic thin films have been produced by various methods such as surface adsorption, vacuum deposition, sputtering, and chemical vapor deposition (CVD) thus far. Particularly, among the surface adsorption methods, the monomolecular build-up process, i.e., the Langmuir-Blodgett (LB) process has attracted special attention as a one capable of providing monomolecular films or multilayered films composed of monomolecular layers. Actually, LB films of many materials such as optically functioning materials (e.g., merocyanine derivatives which are non-linear optical materials, and cyanine dyes and spiropyran derivatives which are optical recording materials) and bio-molecules have been produced. However, such films still await solutions for the problems of film defects and optimization of the molecular structure for use as a practical material. Hence, they are not yet sufficiently reliable for the practical application.

On the other hand, CVD, sputtering, and vacuum deposition processes are conducted under vacuum to thereby avoid incorporation of impurities into the deposited films. Among these processes, the CVD and the sputtering methods involve high energy at the film deposition, and are therefore used for particular cases in which high reaction energy is required at the film deposition and not for the organic materials which decompose at low temperatures in general. With respect to the filming energy, the vacuum deposition method ranks between the sputtering and the surface adsorption method. Though not applicable to materials in which the temperature of sublimation is near to that of decomposition, the vacuum deposition method is useful for depositing films of materials having temperature difference between decomposition and sublimation, and by optimally setting the sublimation temperature, it has successfully provided films of various molecules including those of TCNQ, TTF, phthalocyanine, and stearic acid.

DESCRIPTION OF THE PRIOR ART

Most of the organic materials described hereinbefore for use in thin film deposition are of low purity and generally contain considerable amounts of impurities which are incorporated during the synthesis thereof. If such materials were to be directly deposited, it is feared that the resulting films contain impurities at high concentration. Thus, it was necessary in the conventional processes to incorporate a step of purifying the raw materials by, for example, sublimating and recrystallizing them under reduced pressure before the deposition step.

An object of the present invention is, accordingly, to provide a process for vacuum depositing thin films of organic materials comprising at least once a step of sublimating and recrystallizing the raw material, to thereby simplify the operation and to thereby provide films of improved quality by reducing the impurity concentration thereof.

SUMMARY OF THE INVENTION

The first embodiment of the present invention is characterized in that it provides a process for depositing an organic thin film, comprising at least once a step of sublimating and recrystallizing the raw material prior to depositing the film on a substrate.

The second embodiment of the present invention is characterized in that it provides an apparatus which enables the process of the first embodiment, comprising a provisional substrate and a substrate holder equipped with a rotational mechanism or a conveyor mechanism.

The third embodiment of the present invention is characterized in that it provides a process and an apparatus therefor, in which the raw material purification step(s) and the film deposition step are continuously conducted without exposure to air outside the apparatus, thereby capable of controlling the impurity concentration to a low level.

The present invention provides a process in which the impurity removing step and the thin film deposition step, the steps which were separately conducted in the conventional processes, are concurrently carried out in a single apparatus. Thus, the process is reduced in steps and, thin films of increased purity can be obtained since the film deposition is conducted immediately after removing the impurities.

The present invention has therefore high effect on simplifying the process and improving the reliability of the thin films; thus, it is useful for the mass production of high quality thin films at low cost.

Figure 1:
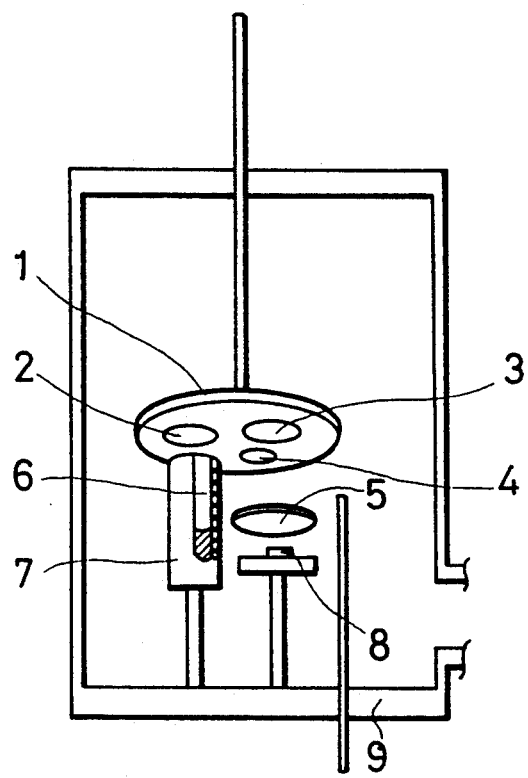
FIG. 1 is a schematic diagram of the thin-film deposition apparatus for use in depositing a single-component material in a process comprising the step of removing the impurities once.

1—Holder for the provisional substrate;

2—Provisional substrate for depositing the film from the materials, at the initial stage of heating the cell;

3—Provisional substrate for depositing the film from the materials, at the intermediate stage of heating the cell;

4—Provisional substrate for depositing the film from the materials, at the final stage of heating the cell;

5—Shutter;
6—Cell heater;
7—Cell for sublimating the materials;
8—Substrate;
9—Vacuum chamber;
10—Heating process of the cell;
11—Stable state of the cell temperature;
12—Lowering the cell temperature;
13—Provisional substrate for the film deposition of one material containing impurities;
14—Provisional substrate for the film deposition of the same material as that in 13 but with increased purity;
15—Provisional substrate for the film deposition of the other material containing impurities;
16—Provisional substrate for the film deposition of the same material as that in 15 but with increased purity;
17—Sublimation cell for the sublimating materials to substrates 13 and 14;
18—Sublimation cell for the sublimating materials to substrates 15 and 16;
19—Substrate;
20—Holder for the provisional substrate;
21—Provisional substrate for the film obtained in the first sublimation of the material containing impurities;
22—Provisional substrate for the film obtained in the first sublimation of the material with purity being increased;
23—Holder of the provisional substrate for the film obtained in the first sublimation of the material containing impurities;
24—Cell for sublimating the material;
25—Substrate;
26—Provisional substrate for the film obtained in the second sublimation of the material containing impurities;
27—Provisional substrate for the film obtained in the second sublimation of the material with purity being increased:
28—Holder of the provisional substrate for the film obtained in the second sublimation of the material containing impurities;
29—Partition;
30—One of the provisional substrates;
31—One of the provisional substrates;
32—One of the provisional substrates;
33—One of the provisional substrates;
34—Holder for the provisional substrate;
35—Cell for sublimating the material;
36—Substrate;
37—Window through which the laser beam is introduced;
38—Shutter;
39—Shutter for generating laser beam in pulses;
40—Partition;
41—Upper electrode;
42—Lead phthalocyanine film;
43—Lower electrode;
44—Substrate.

DETAILED DESCRIPTION OF THE INVENTION

The present invention is described in further detail below referring to some examples. In the description hereinafter, the sublimation and recrystallization step intended for removing the impurities is denoted as the first sublimation/recrystallization step, and that intended for the film deposition is denoted as the second sublimation/ recrystallization step.

An example of depositing a thin film of a single molecule, which comprises removing the impurities in a single step is described below. In the process according to the present invention, the sublimation intended for removing the impurities requires delicate temperature control in the vicinity of the sublimation point of the materials; thus, suitable is to employ heating with a heater or the like as the means for imparting the sublimation energy. In the sublimation intended for film deposition, on the other hand, there is no particular restriction and any of the means can be used, for example, heating, irradiating infrared beams, and irradiating laser beams. In the following example, however, heating with a heater is employed.

In FIG. 1 is shown schematically the apparatus used for the film deposition. The material is first sublimated in the cell [7] for sublimation, which then recrystallizes on the provisional substrate established on the substrate holder [1]. The second sublimation is then conducted by heating the provisional substrate to thereby deposit the film on substrate [8]. The first and the second sublimation are both carried out in the temperature range of from 100° to 500° C., but the first one is intended for removing the impurities while the second one is for depositing the thin film. The sublimation processes are conducted in a chamber under high to super-high vacuum to thereby avoid inclusion of impurities.

Figure 3:
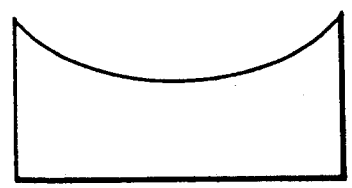
FIG. 3 is a cross sectional view of the provisional substrate.

The holder for the provisional substrate are furnished with two or more types of substrate, and to one of them is provided a heating mechanism. In the embodiment shown in FIG. 1, three types of provisional substrates, i.e., [2], [3], and [4], are provided. These are used in correspondence with the cell temperature at the sublimation step. The substrate [2] is used for recrystallizing the material and impurities which sublimated during elevating the temperature to the stable temperature, whereas the substrate [3] is provided for recrystallizing the material of high purity which sublimated after the temperature reached a stable state. The substrate [4] is for the material sublimated at the final stage during maintaining the stable temperature and for those sublimated during lowering the temperature; but the substrate [2] may be used in place of this substrate. Since the substrate [3] is used in the second sublimation, this substrate is equipped with a heating mechanism. Since the sublimation may extend in the second sublimation to a large area if a flat substrate is to be used, it is preferred that the surface of the substrate be provided in a concave shape as shown in FIG. 3. The provisional substrate, which is made of a material not reactive with the organic material, e.g., quartz, is temperature-controlled to room temperature or lower.

The second sublimation is conducted after rotating the holder [1] to superpose the provisional substrate [3] on the substrate [8], by optimally controlling the temperature of the film on the substrate. The temperature of the substrate must be precisely controlled both above and below the room temperature in the range of from $-100°$ to 400° C. If necessary, there may be provided a shutter [5] between the provisional substrate [3] and the substrate [8].

Figure 4:
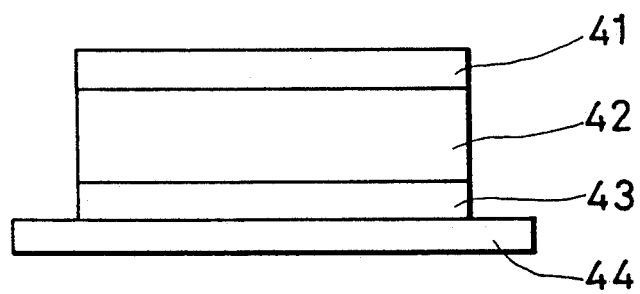
FIG. 4 is a schematically shown structure of a switching device using lead phthalocyanine.

In the example described above, only one type of molecule is sublimated. However, in the case of sublimating two or more types of molecules, a plurality of disc holders [1]for the provisional substrate may be provided so that the film may be deposited on a single substrate; alternatively, as shown in FIG. 4, the provisional substrates for the other molecules may be provided on the same holder for the provisional substrates.

In the example above, the first sublimation/recrystallization is conducted only once. In case a raw material of high impurity level is used, or in case there is further required to increase the purity of the material, the process may be easily modified into a one comprising two or more steps of this sublimation/recrystallization treatment.

Furthermore, instead of using thermal excitation for the second sublimation, there may be employed laser beam excitation or other photoexcitation means, as described earlier. It is also possible, by controlling laser pulses or the like, to deposit films the molecular layers of which are well controlled.

The invention will be described in further detail referring to some examples below, but it should be understood that the present invention is not to be construed as being limited thereto.

EXAMPLE 1

An example of depositing a thin film of phthalocyanine is described. In the examples hereinafter, the sublimation and recrystallization step intended for removing the impurities is denoted as the first sublimation/recrystallization step, and that intended for the film deposition is denoted as the second sublimation/recrystallization step. As the phthalocyanine (Pc) suitably used in the process according to the present invention, mentioned are the sublimable complex salts represented by PcM(II) (where, M(II) represents Cr, Fe, Co, Ni, Cu, Zn, Pt, Pd, and Pb), from which such having Pb as the M(II), denoted lead phthalocyanine hereinafter, is used in the present example.

Figure 2:
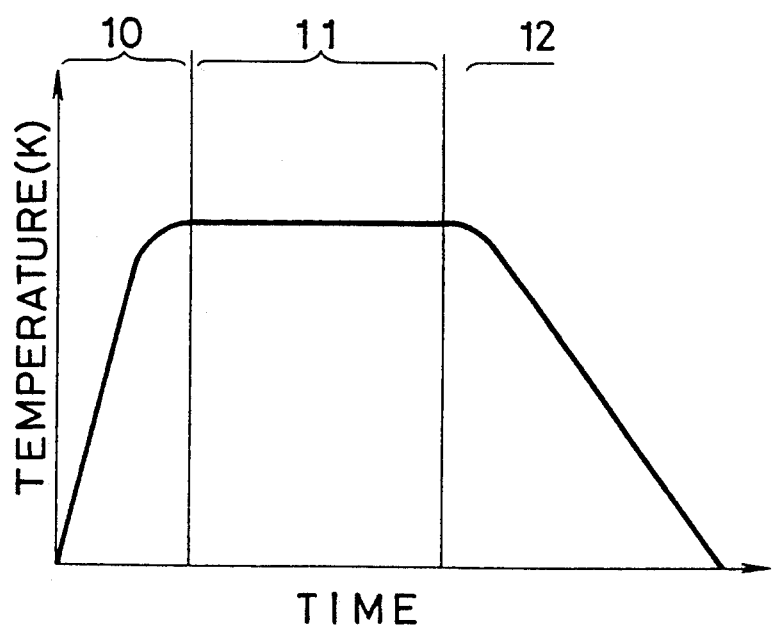
FIG. 2 is a graph showing the relation between the cell temperature for sublimating the material and the provisional substrate.

For the film deposition apparatus, there was used one schematically shown in FIG. 1, i.e., the apparatus having such a set up for a process comprising only once the impurity removing step. First, the material was charged into the cell [7] shown in FIG. 1, and was heated with a heater [6] after establishing a provisional substrate [3] at the upper portion thereto. The heater was controlled in such a manner that the heating temperature may not exceed the sublimation temperature of the phthalocyanine, i.e., the temperature range of from 400° to 500° C. Since sublimation of the impurities is believed to occur during heating the cell to the sublimation temperature of phthalocyanine, that is, during the period shown with [10] in FIG. 2, the sublimated products were recrystallized on the provisional substrate [2]. After the temperature reached the predetermined temperature, i.e., during the stable temperature period shown with [11] in FIG. 2, [1] was rotated in such a manner that the provisional substrate [2]was exchanged by [3], to thereby obtain recrystallized material of high purity. Particular heating or cooling was not applied to the provisional substrate [3] at this stage. In the subsequent lowering of the cell temperature, i.e., during the period shown with [12] in FIG. 2, a provisional substrate [4] or the provisional substrate [2] above was used for the sublimation/recrystallization so that no impurity might be incorporated in the object material recrystallized on the provisional substrate [3].

Upon completion of the recrystallization on the provisional substrate [3], [1] was rotated to place the provisional substrate [3] on the substrate to prepare for the sublimation intended for the film deposition. The heating temperature of the provisional substrate was fixed to the sublimation temperature of the material, and was set as such that the substrate temperature may be controlled in the temperature range of from −100° to 200° C. The shutter [5]was closed at first so that the molecules as impurities may not be incorporated to the substrate at the first sublimation/recrystallization, but was opened after the temperature was stabilized at the second sublimation to thereby deposit the film on the substrate. To prevent inclusion of impurities during the process steps, the inside of the chamber [9] was maintained at a high vacuum in the range of from $10^{-5}$ to $10^{-10}$ Torr, specifically, at $10^{-7}$ Torr. Thus was obtained a submicron or micron thick film of lead phthalocyanine, and it was fabricated into a sandwich-structured device, as shown in FIG. 4, on which the switching characteristics were evaluated.

For the structure and the evaluation method therefor, reference was made to Th. Frauen, C. Hamann and M. Muller, *Phys. Status Solidi,* a86 (1984) p. 735, and to S. Asakawa, A. Taomoto and K. Ninogi, *Oyo Butsuri(in Jap.),* Vol. 59(1) (1990) p. 54.

The switching time (1 nsec) of the device according to the present invention was shortened to one tenth of that (10 nsec) of the conventional devices in which films deposited by separately conducting sublimation purification and film deposition are used. The quick switching is a result of using the film reduced in impurities, having deposited according to the present invention.

EXAMPLE 2

Figure 5:
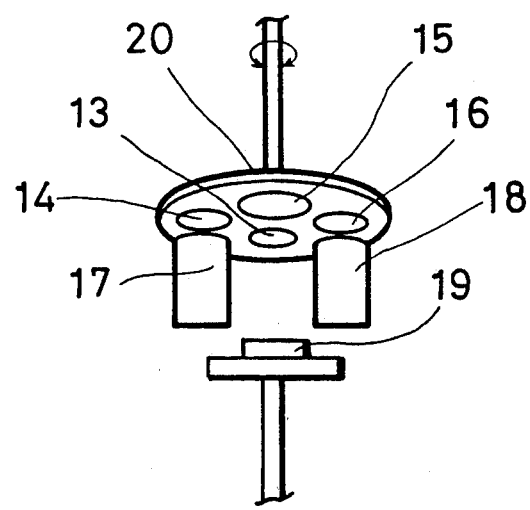
FIG. 5 is a schematic diagram of the thin-film deposition apparatus for use in depositing two different materials in a process comprising the step of removing the impurities once.

An example of depositing a thin film of a charge transfer complex, $(TMTSF)_m(Me_2TCNQ)_n$, in an apparatus shown in FIG. 5 is described below. The structure of the apparatus is substantially the same as that used in Example 1; the only difference is that a single holder for provisional substrates deals with two types of molecules. Among the provisional substrates, [13] and [14] were used for TMTSF, and those [15] and [16] were used for Me$_2$TCNQ. Furthermore, [14] and [16] were provided for the recrystallization of high purity materials, whereas [13] and [15] were used in the periods corresponding to [10] and [12] in FIG. 2, for recrystallizing materials containing impurities. That is, the latter two provisional substrates are corresponding to those [2] and [4] in FIG. 1.

In carrying out the first sublimation, two sublimation cells were located at the position diagonal to each other, as shown in FIG. 5. The temperature control of the substrate, the cells and the provisional substrates, as well as the control of the holder for the provisional substrates was conducted in a similar manner as in Example 1. The second sublimation may be effected simultaneously from [14] and [16], or may be effected in turns to provide a layered structure of alternated layers. In the present example, the latter process was employed to obtain an alternated layered structure composed of 10 layers each. Thus was obtained a thin film of a charge-transfer complex composed of two molecules, i.e., the donor and the acceptor molecules, on substrate [19].

The electric conductivity of the thin film thus obtained was measured, and the result was compared with that of a sample deposited by a conventional process in which sublimation purification and film deposition were separately conducted. The conductivity ($10^{-3}$ Ω/cm) of the thin film according to the present invention was ten times as high as that ($10^{-2}$ Ω/cm) of the thin film deposited by a conventional process.

EXAMPLE 3

Figure 6:
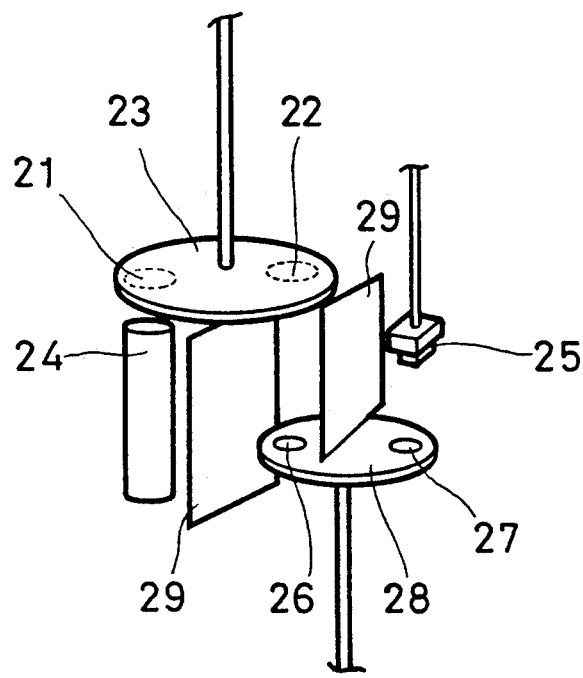
FIG. 6 is a schematic diagram of the thin-film deposition apparatus for use in depositing a single-component material in a process comprising the step of removing the impurities twice.

An example for depositing a thin film of TCNQ molecules by a process comprising twice a step of removing of impurities and a subsequent film deposition is described below. In FIG. 6 is given the schematic view of the apparatus used in the process. In the cell [24] was charged TCNQ, and in a similar procedure as in Examples 1 and 2, the material containing the impurities was first recrystallized on the provisional substrate [21], followed by the second recrystallization on the provisional substrate [22] after rotating the holder for the provisional substrates [23] to obtain a purified material on the provisional substrate [22]. Then, by taking the provisional substrate [22] as a cell, the same procedure comprising the steps above was repeated to recrystallize materials of relatively low purity on the provisional substrate [26] while recrystallizing the material of higher purity on provisional substrate [27]. Finally, the film was deposited on substrate [25] from the provisional substrate [27]. In this case, however, to avoid too much extension of the molecules having sublimated from [22] and [27], partitions [29] were provided in the chamber. Thus was obtained a thin film of high purity TCNQ molecules on the surface of the substrate [25].

The thin film of TCNQ thus obtained was subjected to structural analysis using X-ray diffraction. By comparing the result obtained on the thin film TCNQ deposited according to the process of the invention with that obtained on a conventional thin film deposited by a process in which sublimation purification and film deposition were separately conducted, it was found that the X-ray peak broadening of the thin film according to the present invention was decreased by about 30% with respect to the latter. This indicates that the thin film according to the present invention is increased in crystallinity, ascribed to the reduced concentration of the impurities.

EXAMPLE 4

Figure 7:
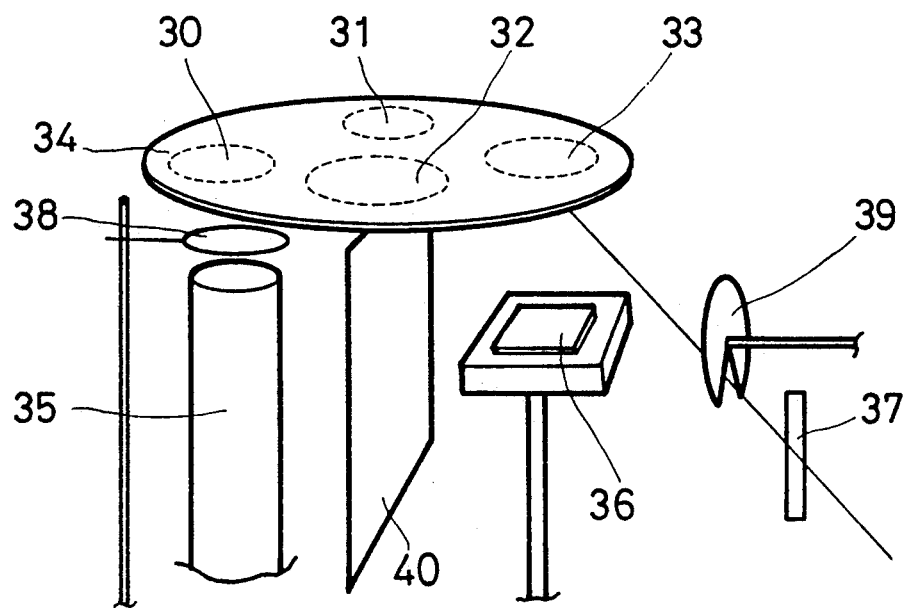
FIG. 7 is a schematic diagram of the thin-film deposition apparatus for use in depositing a single-component material in a process comprising the step of removing the impurities once, using laser beam for depositing the film.

An example of depositing a thin film of TCNQ molecules using a laser beam for the second sublimation is described below. In FIG. 7 is shown schematically the apparatus for use in the process. The material was sublimated from the cell [35] to obtain a film, for example, on the provisional substrate [33]. In the present process, four provisional substrates [30], [31], [32], and [33] were provided in the apparatus, but there is no particular limitation on the number of provisional substrates to be used. The characteristic feature of the present process as compared with the preceding three Examples is that a shutter [38] was established, whereas in the Examples described earlier the holder for the provisional substrates functioned as the shutter By setting up the apparatus in this way, high purity materials recrystallize on all the provisional substrates [30] to [33] in the present process On the provisional substrates were sequentially recrystallized high purity materials by rotating the holder [34] for the provisional substrates. The second sublimation was conducted by irradiating a laser beam through the window [37] onto the provisional substrate having completed the first sublimation, when the provisional substrate came right over the substrate [36], so that a thin film may be deposited on the substrate. The provisional substrates [30] to [33] were each about 5 mm square in size, and were made of ceramics such as quartz so that they may well resist to laser beam irradiation. The laser for use in the process is preferably such which emits an infrared or a visible light, and in the present process, an Nd:YAG laser was used. Film deposition was carried out by irradiating a beam having a relatively enlarged beam diameter (from 2 to 3 mm or larger), since too high a laser beam energy decomposed the TCNQ molecule and since there was required to uniformly heat the whole substrate. In the course of laser beam irradiation, the rotary shutter [39] was operated so a pulsed beam may hit the substrate, and in this way, reaction such as decomposition of the film material can be avoided even in a long in a long period of laser beam irradiation. The partition [40]functions in the same manner as that shown in FIG. 6. Thus was obtained a thin film of a high purity TCNQ.

The thin film of TCNQ thus obtained was subjected to structural analysis using X-ray diffraction in the same manner as in Example 3. By comparing the result obtained on the thin film TCNQ deposited according to the process of the invention with that obtained on a conventional thin film deposited by a process in which sublimation purification and film deposition were separately conducted, it was found that the X-ray peak broadening of the thin film according to the present invention was decreased by about 20% with respect to the latter. This indicates that the thin film according to the present invention is increased in crystallinity, ascribed to the reduced concentration of the impurities.

While the invention has been described in detail and with reference to specific embodiments thereof, it will be apparent to one skilled in the art that various changes and modifications can be made therein without departing from the spirit and scope thereof. As an example of such modifications, sublimation for purification may be carried out by elevating a temperature of an organic material provided in a cell for sublimation to a temperature not lower than a temperature at which sublimation of the organic material starts when elevating the temperature thereof.

What is claimed is:

1. A method for forming an organic film comprising the steps of:
   purifying an organic material; and
   depositing the purified organic material on a substrate by subliming the purified organic material
   wherein both said purifying step and said depositing step are performed in the same chamber.

2. The method of claim 1 wherein said purifying step is carried out by subliming said organic material.

3. The method of claim 2 wherein the sublimation during said purifying step is carried out by heating said organic material by a heater.

4. The method of claim 1 wherein said purifying step is carried out by elevating a temperature of said organic material to a subliming temperature and subsequently continuing the subliming temperature where auxiliary substrates provided in said chamber change places in order to deposit on at least one of said auxiliary substrates an organic layer having a purity higher than that of said organic material.

5. The method of claim 4 wherein said subliming temperature is not lower than a temperature at which sublimation of said organic material starts when elevating the temperature thereof.

6. The method of claim 1 wherein said purifying step is carried out by elevating a temperature of said organic material to a subliming temperature and subsequently continuing the subliming temperature where a shutter provided in said chamber intervenes between said organic material and an auxiliary substrate provided in said chamber during said purifying step and subsequently said shutter is removed during said purifying step in order to deposit on said auxiliary substrate an organic layer having a purity higher than that of said organic material.

7. The method of claim 6 wherein said subliming temperature is not lower than a temperature at which sublimation of said organic material starts when elevating the temperature thereof.

8. The method of claim 1 wherein said depositing step is carried out by heating the purified organic material by a heater.

9. The method of claim 1 wherein said depositing step is carried out by radiating the purified organic material with rays selected from the group consisting of infrared rays and laser rays.

10. The method of claim 1 wherein the purified organic material is not exposed to air until said depositing step is finished.

11. A method of forming an organic film comprising the steps of:
- purifying an organic material by subliming a raw material to form a purified film on an auxiliary substrate, and
- depositing the purified organic material on a substrate by subliming the purified organic material with an energy selected from the group consisting of laser rays and infrared rays.
- wherein both the purifying step and the depositing step are successively performed in one chamber under a reduced pressure.

* * * * *